US012660631B2

(12) United States Patent
Chen et al.

(10) Patent No.: US 12,660,631 B2
(45) Date of Patent: Jun. 16, 2026

(54) FAN-OUT PACKAGING STRUCTURE AND METHOD FOR MANUFACTURING SAME

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, Jiangsu (CN)

( * ) Notice: Subject to any disclaimer, the term of this patent is extended or adjusted under 35 U.S.C. 154(b) by 515 days.

(21) Appl. No.: 18/133,161

(22) Filed: Apr. 11, 2023

(65) Prior Publication Data

US 2023/0335514 A1      Oct. 19, 2023

(30) Foreign Application Priority Data

Apr. 15, 2022      (CN) .......................... 202210414877.X

(51) Int. Cl.
*H01L 23/66* (2006.01)
*H01L 21/56* (2006.01)
*H01L 21/683* (2006.01)
*H01L 23/00* (2006.01)
(Continued)

(52) U.S. Cl.
CPC ............ *H01L 23/66* (2013.01); *H01L 21/565* (2013.01); *H01L 21/6835* (2013.01); *H01L 23/3121* (2013.01); *H01L 23/5389* (2013.01); *H01L 24/04* (2013.01); *H01L 24/13* (2013.01); *H01L 2223/6677* (2013.01); *H01L 2224/0231* (2013.01); *H01L 2224/02379* (2013.01); *H01L 2224/04105* (2013.01);
(Continued)

(58) Field of Classification Search
CPC . H01L 23/66; H01L 23/3121; H01L 23/5389; H01L 23/552; H01L 23/3128; H01L 23/49816; H01L 21/565; H01L 21/6835; H01L 21/4857; H01L 21/56; H01L 24/04; H01L 24/13; H01L 2223/6677; H01L 2224/0231; H01L 2224/02379; H01L 2224/04105; H01L 2224/12105; H01L 2224/13024
See application file for complete search history.

(56) References Cited

U.S. PATENT DOCUMENTS

| 10,777,518 | B1 * | 9/2020 | Wang | .................. H01L 23/5383 |
| 2020/0035625 | A1 * | 1/2020 | Wang | .................. H01Q 1/2283 |
| 2020/0411948 | A1 * | 12/2020 | Lin | ...................... H01Q 1/2283 |

(Continued)

*Primary Examiner* — Dao H Nguyen
(74) *Attorney, Agent, or Firm* — IPRTOP LLC

(57) ABSTRACT

A fan-out packaging structure includes a first dielectric layer, a first antenna layer, a first packaging layer, a first redistribution layer, a second packaging layer, a second redistribution layer, a first conductive pillar, a second conductive pillar, a chip, and a solder bump. Two ends of the first conductive pillar connect to the first antenna layer and the second antenna layer; two ends of the second conductive pillar connect to the second antenna layer and the second redistribution layer. The chip is in the second packaging layer, and electrodes of the chip are electrically connected to the second redistribution layer, and a chip backside layer is bonded to the first redistribution layer; the solder bump is located over the second redistribution layer. There is only one support carrier for multiple layers of antennas and the chip, reducing the package size. The backside layer isolates the antennas from the chip interference.

6 Claims, 4 Drawing Sheets

(51) Int. Cl.
    H01L 23/31        (2006.01)
    H01L 23/538      (2006.01)

(52) U.S. Cl.
    CPC ............... *H01L 2224/12105* (2013.01); *H01L*
        *2224/13024* (2013.01); *H01L 2924/3511*
        (2013.01)

(56)           References Cited

U.S. PATENT DOCUMENTS

| | | | | |
|---|---|---|---|---|
| 2022/0254741 | A1* | 8/2022 | Chen ................... | H01L 21/6835 |
| 2023/0178530 | A1* | 6/2023 | Wang ................... | H01L 23/481 |
| | | | | 257/659 |
| 2023/0216201 | A1* | 7/2023 | Lee .................... | H01L 23/3128 |
| | | | | 257/659 |
| 2023/0335453 | A1* | 10/2023 | Chen ........................ | H01Q 1/38 |

* cited by examiner

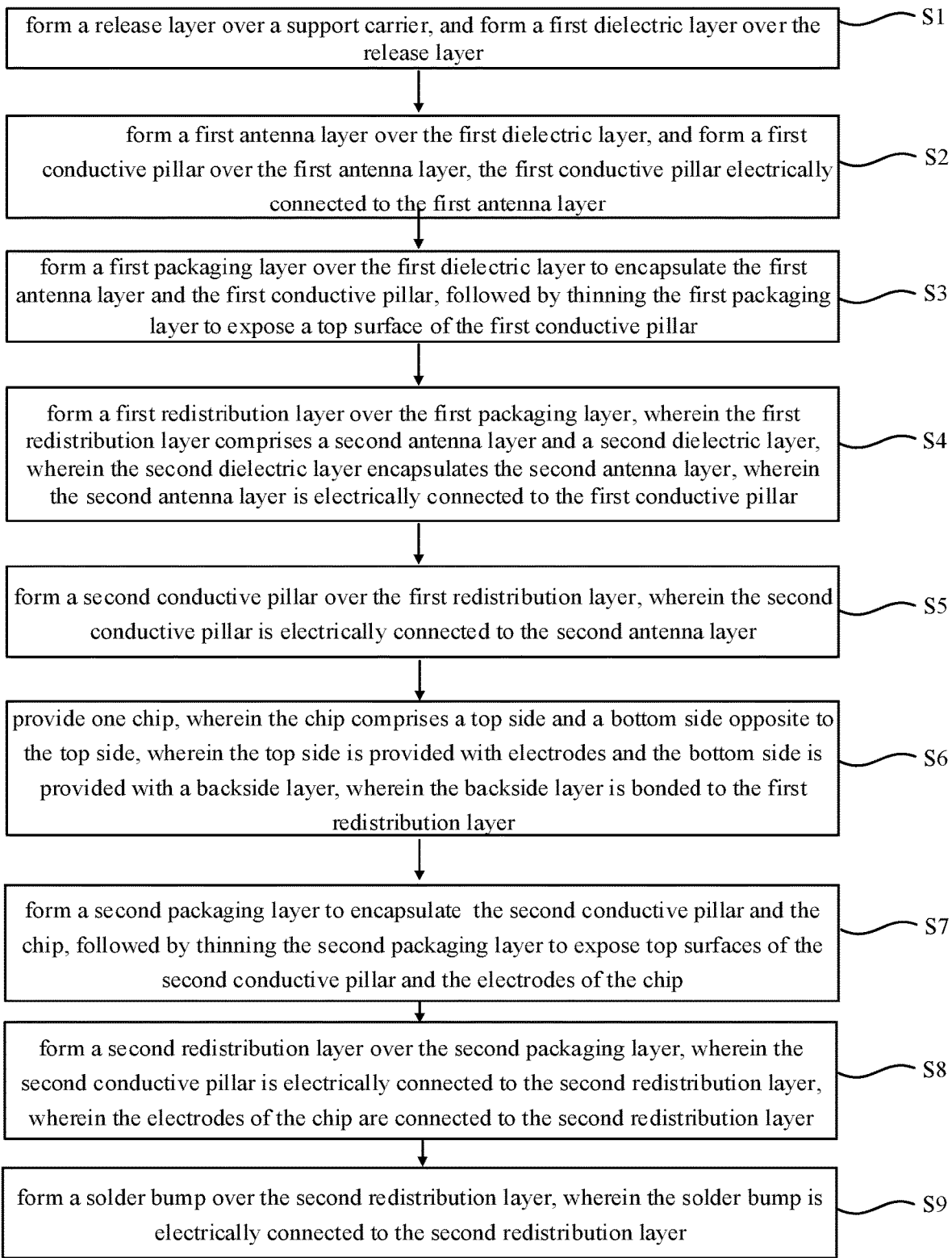

| | |
|---|---|
| form a release layer over a support carrier, and form a first dielectric layer over the release layer | S1 |
| form a first antenna layer over the first dielectric layer, and form a first conductive pillar over the first antenna layer, the first conductive pillar electrically connected to the first antenna layer | S2 |
| form a first packaging layer over the first dielectric layer to encapsulate the first antenna layer and the first conductive pillar, followed by thinning the first packaging layer to expose a top surface of the first conductive pillar | S3 |
| form a first redistribution layer over the first packaging layer, wherein the first redistribution layer comprises a second antenna layer and a second dielectric layer, wherein the second dielectric layer encapsulates the second antenna layer, wherein the second antenna layer is electrically connected to the first conductive pillar | S4 |
| form a second conductive pillar over the first redistribution layer, wherein the second conductive pillar is electrically connected to the second antenna layer | S5 |
| provide one chip, wherein the chip comprises a top side and a bottom side opposite to the top side, wherein the top side is provided with electrodes and the bottom side is provided with a backside layer, wherein the backside layer is bonded to the first redistribution layer | S6 |
| form a second packaging layer to encapsulate the second conductive pillar and the chip, followed by thinning the second packaging layer to expose top surfaces of the second conductive pillar and the electrodes of the chip | S7 |
| form a second redistribution layer over the second packaging layer, wherein the second conductive pillar is electrically connected to the second redistribution layer, wherein the electrodes of the chip are connected to the second redistribution layer | S8 |
| form a solder bump over the second redistribution layer, wherein the solder bump is electrically connected to the second redistribution layer | S9 |

FIG. 1

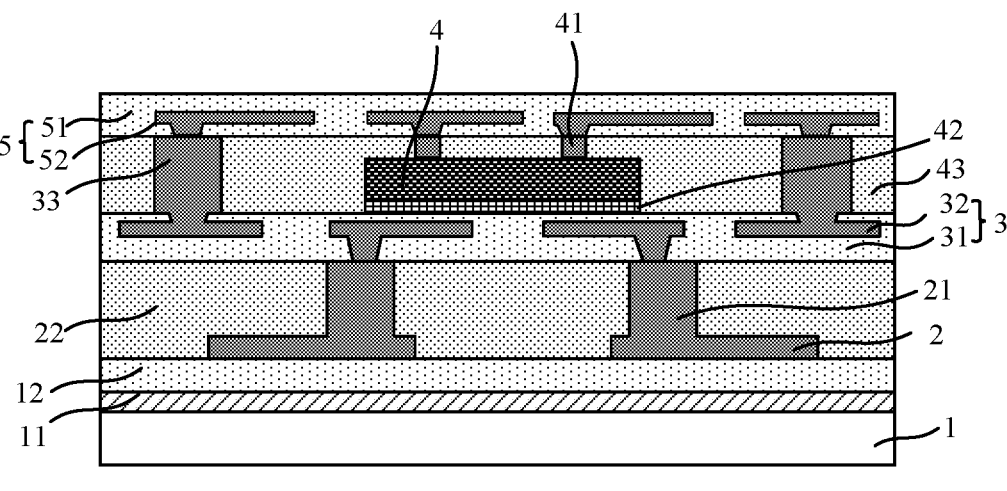
FIG. 10
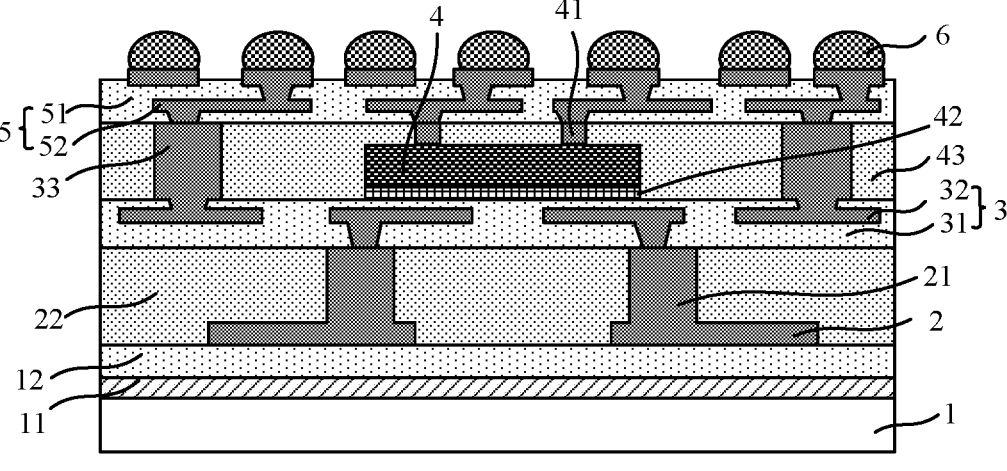
FIG. 11
FIG. 12

FAN-OUT PACKAGING STRUCTURE AND METHOD FOR MANUFACTURING SAME

CROSS REFERENCE TO RELATED APPLICATION

The present application claims the benefit of priority to Chinese Patent Application No. CN 202210414877X, entitled "FAN-OUT PACKAGING STRUCTURE AND METHOD FOR MANUFACTURING SAME", filed with CNIPA on Apr. 15, 2022, the disclosure of which is incorporated herein by reference in its entirety for all purposes.

FIELD OF TECHNOLOGY

The present disclosure generally relates to integrated circuits, in particular to, a fan-out packaging structure and a method for manufacturing the same.

BACKGROUND

Fan-Out Wafer-Level Packaging (FOWLP) technology has become one of the most promising technologies to meet the needs of electronic devices for mobile and network applications as consumers demand more functions, better performance, and higher energy efficiency at lower cost and smaller physical sizes.

Advances in technology have led to the development of miniaturized and multi-functional wireless communication technologies. Antennas are an important part of wireless communication, and they need cooperations among chips of several functional modules to realize transmission and reception of signals. Usually, when packaging antennas, chips of functional modules are assembled on the printed circuit board (PCB), resulting in shortcomings such as, a larger package size, a longer signal transmission path, poor integration, complex packaging processes. Commercial communication equipment has increasingly more functions, and therefore requires a higher transmission rate. Currently, a wireless communication device usually has two or more antenna modules, and due to the restriction of product size, electromagnetic interference inevitably exists between the function modules when they are working, which causes poor performance and low equipment reliability.

Therefore, how to provide a new packaging structure and a method for manufacturing the same has become an important technical problem to be solved by the technical personnel in the field.

SUMMARY

The present disclosure provides a method for manufacturing a fan-out packaging structure, comprising: forming a release layer over a support carrier, and forming a first dielectric layer over the release layer; forming a first antenna layer over the first dielectric layer, and forming a first conductive pillar over the first antenna layer, wherein the first conductive pillar is electrically connected to the first antenna layer; forming a first packaging layer over the first dielectric layer to encapsulate the first antenna layer and the first conductive pillar, followed by thinning the first packaging layer to expose a top surface of the first conductive pillar; forming a first redistribution layer over the first packaging layer, wherein the first redistribution layer comprises a second antenna layer and a second dielectric layer, wherein the second dielectric layer encapsulates the second antenna layer, and wherein the second antenna layer is electrically connected to the first conductive pillar; forming a second conductive pillar over the first redistribution layer, wherein the second conductive pillar is electrically connected to the second antenna layer; providing at least one chip, wherein the chip comprises a top side and a bottom side opposite to the top side, wherein the top side is provided with electrodes and the bottom side is provided with a backside layer, wherein the backside layer is bonded to the first redistribution layer; forming a second packaging layer to encapsulate the second conductive pillar and the chip, followed by thinning the second packaging layer to expose top surfaces of the second conductive pillar and the electrodes of the chip; forming a second redistribution layer over the second packaging layer, wherein the second conductive pillar is electrically connected to the second redistribution layer, and wherein the electrodes of the chip are connected to the second redistribution layer; and forming a solder bump over the second redistribution layer, wherein the solder bump is electrically connected to the second redistribution layer.

The present disclosure also provides a fan-out packaging structure, comprising: a first dielectric layer; a first antenna layer, disposed over the first dielectric layer; a first conductive pillar, disposed over the first antenna layer and electrically connected to the first antenna layer; a first redistribution layer, disposed over the first packaging layer, wherein the first redistribution layer comprises a second antenna layer and a second dielectric layer encapsulating the second antenna layer, and the second antenna layer is electrically connected to the first conductive pillar; a first packaging layer, disposed between the first dielectric layer and the first redistribution layer, wherein the first packaging layer encapsulates the first antenna layer and side walls of the first conductive pillar; a second conductive pillar, disposed over the first redistribution layer and electrically connected to the second antenna layer; one chip, wherein the chip comprises a top side and a bottom side opposite to the top side, wherein the top side is provided with electrodes and the bottom side is provided with a backside layer, wherein the backside layer is bonded to the first redistribution layer; a second redistribution layer, disposed over the second conductive pillar and the chip, and wherein the second redistribution layer is electrically connected to the second conductive pillar and the chip; a second packaging layer, disposed between the first redistribution layer and the second redistribution layer, and wherein the second packaging layer encapsulate side walls of the second conductive pillar and a top surface of the chip; and a solder bump, disposed over the second redistribution layer and electrically connected to the second redistribution layer.

BRIEF DESCRIPTION OF THE DRAWINGS

FIG. 1 shows a flow chart illustrating a method for manufacturing a fan-out packaging structure of the present disclosure.

Figures 2, 3, 4, 5, 6:
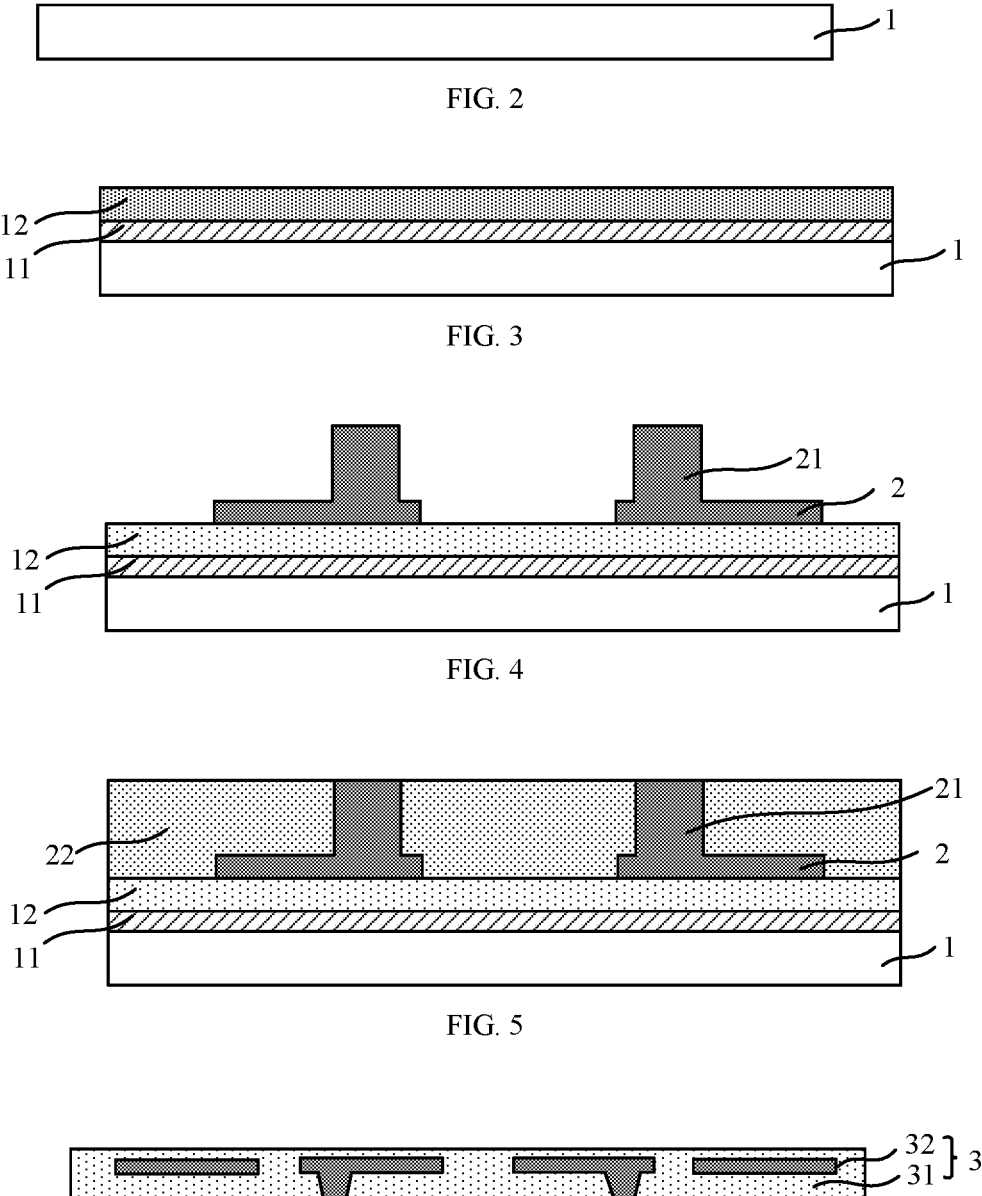
FIG. 2 shows a schematic diagram of a support carrier used in the method for manufacturing the fan-out packaging structure of the present disclosure.
FIG. 3 shows a schematic diagram of an intermediate structure obtained after a release layer and a first dielectric layer are sequentially formed over a support carrier in the method for manufacturing the fan-out packaging structure of the present disclosure.
FIG. 4 shows a schematic diagram of an intermediate structure obtained after a first antenna layer and a first conductive pillar are formed over a first dielectric layer in the method for manufacturing the fan-out packaging structure of the present disclosure.

FIG. 5 shows a schematic diagram of an intermediate structure obtained after a first packaging layer is formed over a first dielectric layer in the method for manufacturing the fan-out packaging structure of the present disclosure.

FIG. 6 shows a schematic diagram of an intermediate structure obtained after a first redistribution layer is formed over a first packaging layer in the method for manufacturing the fan-out packaging structure of the present disclosure.

Figure 7:
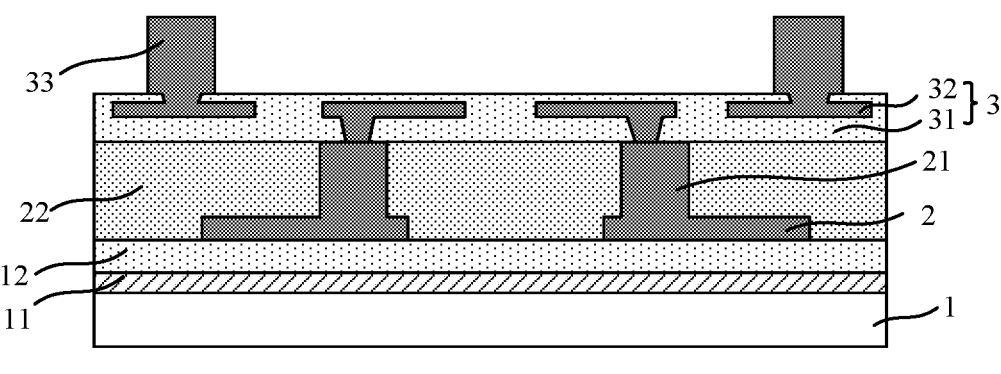

FIG. 7 shows a schematic diagram of an intermediate structure obtained after a second conductive pillar is formed over a first redistribution layer in the method for manufacturing the fan-out packaging structure of the present disclosure.

Figure 8:
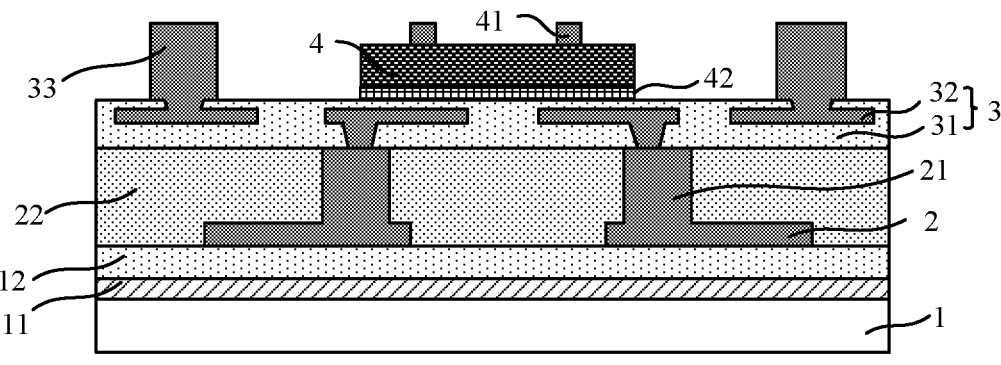

FIG. 8 shows a schematic diagram of an intermediate structure obtained after a chip is disposed over a first redistribution layer in the method for manufacturing the fan-out packaging structure of the present disclosure.

Figure 9:
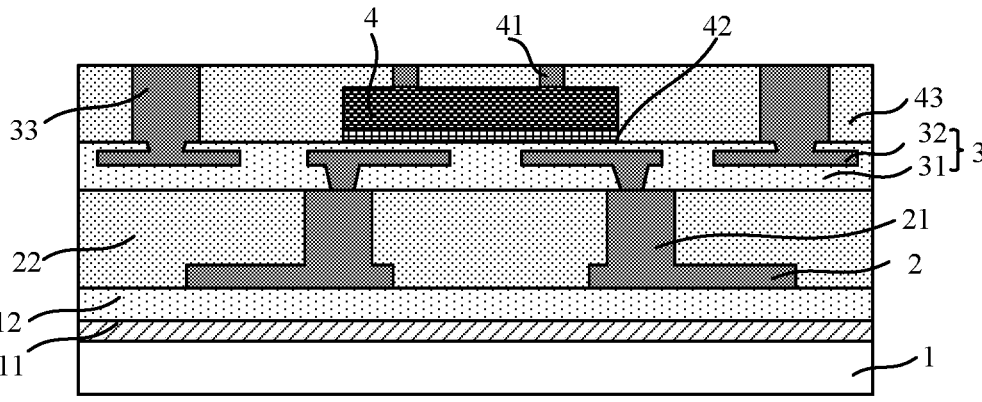

FIG. 9 shows a schematic diagram of an intermediate structure obtained after a second packaging layer is formed over a first redistribution layer in the method for manufacturing the fan-out packaging structure of the present disclosure.

FIG. 10 shows a schematic diagram of an intermediate structure obtained after a second redistribution layer is formed over a second packaging layer in the method for manufacturing the fan-out packaging structure of the present disclosure.

FIG. 11 shows a schematic diagram of an intermediate structure obtained after a solder bump is formed over a second redistribution layer in the method for manufacturing the fan-out packaging structure of the present disclosure.

FIG. 12 shows a schematic diagram of a packaging structure obtained after by the method for manufacturing the fan-out packaging structure of the present disclosure.

| Reference Numerals | |
|---|---|
| S1~S9 | Various Steps |
| 1 | Support Carrier |
| 11 | Release Layer |
| 12 | First Dielectric Layer |
| 2 | First Antenna Layer |
| 21 | First Conductive Pillar |
| 22 | First Packaging Layer |
| 3 | First Redistribution Layer |
| 31 | Second Dielectric Layer |
| 32 | Second Antenna Layer |
| 33 | Second Conductive Pillar |
| 4 | Chip |
| 41 | Electrode |
| 42 | Backside Layer |
| 43 | Second Packaging Layer |
| 5 | Second Redistribution Layer |
| 51 | Third Dielectric Layer |
| 52 | Metal Interconnection Layer |
| 6 | Solder Bump |

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based over different viewpoints and applications without departing from the spirit of the present disclosure.

Referring to FIGS. 1 to 12. It should be noted that the drawings provided in this disclosure only illustrate the basic concept of the present disclosure in a schematic way, so the drawings only show the components related to the present disclosure. The drawings are not necessarily drawn according to the number, shape, and size of the components in actual implementation; during the actual implementation, the type, quantity, and proportion of each component can be changed as needed, and the components' layout may also be more complicated.

Embodiment 1

A method for manufacturing a fan-out packaging structure is provided in this embodiment, as shown in FIG. 1, which is a flow chart of the method. The method includes the following steps:

S1: forming a release layer over a support carrier, and forming a first dielectric layer over the release layer;

S2: forming a first antenna layer over the first dielectric layer, and forming a first conductive pillar over the first antenna layer, wherein the first conductive pillar is electrically connected to the first antenna layer;

S3: forming a first packaging layer over the first dielectric layer to encapsulate the first antenna layer and the first conductive pillar, and thinning the first packaging layer to reveal a top surface of the first conductive pillar;

S4: forming a first redistribution layer over the first packaging layer, wherein the first redistribution layer comprises a second antenna layer and a second dielectric layer encapsulating the second antenna layer, and the second antenna layer is electrically connected to the first conductive pillar;

S5: forming a second conductive pillar over the first redistribution layer, wherein the second conductive pillar is electrically connected to the second antenna layer;

S6: providing at least one chip, wherein the chip comprises a top side and a bottom side opposite to the top side, wherein the top side is provided with electrodes and the bottom side is provided with a backside layer, bonding the backside layer to the first redistribution layer;

S7: forming a second packaging layer to encapsulate the second conductive pillar and the chip, and thinning the second packaging layer to expose top surfaces of the second conductive pillar and the electrodes;

S8: forming a second redistribution layer over the second packaging layer, wherein the second conductive pillar is electrically connected to the second redistribution layer and the electrodes are connected to the second redistribution layer; and the electrodes are connected to the second; and S9: forming a solder bump over the second redistribution layer, wherein the solder bump is electrically connected to the second redistribution layer.

Referring to FIGS. 2 to 3, step S1 is first performed, which includes: providing the support carrier 1, forming the release layer 11 over the support carrier 1, and forming the first dielectric layer 12 over the release layer 11.

As an example, the support carrier 1 is first provided as shown in FIG. 2. The support carrier 1 includes, but is not limited to, one of a glass carrier, a metal carrier, a semiconductor carrier, a polymer carrier, and a ceramic carrier; the support carrier 1 is used to prevent cracking, warping, fracturing of layered structure formed on it during packaging, and the support carrier 1 may be wafer-shaped, panel-shaped, or in any other desired shape. In one example, the support carrier 1 is a glass carrier, which is less costly and allows a release layer to form over its surface easily.

As an example, the release layer 11 and the first media layer 12 are formed over the support carrier 1 in sequence, as shown in FIG. 3. The release layer 11 may be made of materials such as an adhesive tape or polymers, molded by UV curing or thermal curing; and the release layer 11 is used as a separation layer between the subsequent packaging structure and the support carrier 1; the first dielectric layer 12 may be made of one or more of epoxy resin, silicone, polyimide, silicon oxide, phosphor silica glass, and fluorinated glass, and may be formed by techniques of physical vapor deposition, chemical vapor deposition, spin-coating, or other suitable methods.

Referring to FIG. 4, step S2 includes: forming the first antenna layer 2 over the first dielectric layer 12, and forming the first conductive pillar 21 over the first antenna layer 2, wherein the first conductive pillar 21 is electrically connected to the first antenna layer 2.

As an example, the method for forming the first antenna layer 2 comprises a deposition process, an etching process, a metal stripping process, or any other suitable process; the first antenna layer includes at least one antenna structure.

As an example, the method for forming the first conductive pillar 21 comprises a lead bonding method, a vapor deposition method, a sputtering method, an electroplating method, a chemical plating method, or any other suitable method, and materials of the first conductive pillar 21 comprise one or more of copper, aluminum, nickel, gold, silver, titanium, and any other suitable conductive material.

Referring to FIG. 5, step S3 includes: forming the first packaging layer over the first dielectric layer to encapsulate the first antenna layer and the first conductive pillar, and thinning the first packaging layer to reveal the top surface of the first conductive pillar;

As an example, the first packaging layer 22 is made of thermosetting materials, which may include one or more of polymer-based materials, resin-based materials, polyimide, and epoxy resin, and may be formed by any one of compression molding, transfer molding, liquid sealing molding, vacuum lamination, and spin coating.

As an example, the method for thinning the first packaging layer 22 may include thinning the packaging layer by a grinding process after the packaging layer is molded, or removing some of the thermosetting materials to reveal the first conductive pillar 21 during the process of molding the first packaging layer while the thermosetting materials have not yet become rigid, which not only avoid grinding processes, but also make the height of the first conductive pillar controllable.

Referring to FIG. 6, step S4 includes: forming the first redistribution layer 3 over the first packaging layer 22, wherein the first redistribution layer 3 comprises the second antenna layer 32 and the second dielectric layer 31 encapsulating the second antenna layer 32, and the second antenna layer 32 is electrically connected to the first conductive pillar 21.

As an example, steps of manufacturing the first redistribution layer comprise: forming an initial dielectric layer over the first packaging layer 22 using a chemical vapor deposition process or a physical vapor deposition process, and etching the initial dielectric layer to form a patterned dielectric layer 31; forming the antenna layer 32 over the patterned dielectric layer 31 using a deposition process, an etching process, a metal stripping process, or other suitable process. Materials of the dielectric layer include, but are not limited to, one or more of epoxy resin, silicone, polyimide, silicon oxide, phosphor silica glass, and fluorine-containing glass.

As an example, the above steps can be repeated as needed to form a plurality of dielectric layers 31 and a plurality of antenna layers 32 that are alternately stacked together; and depending on connectivity needs, the layers can be electrically interconnected by graphically etching each dielectric layer or manufacturing through-holes therein.

Referring to FIG. 7, step S5 includes: forming the second conductive pillar 33 over the first redistribution layer 3, wherein the second conductive pillar 33 is electrically connected to the second antenna layer 32.

Specifically, before forming the second conductive pillar 33, the second dielectric layer 31 over the first redistribution layer 3 is etched to form through-holes to reveal the second antenna layer 32, and then the second conductive pillar 33 is formed by lead bonding, vapor deposition, sputtering, electroplating, chemical plating, or other suitable methods; the material of the second conductive pillar 33 may include at least one of copper, aluminum, nickel, gold, silver, and titanium.

Referring to FIG. 8, step S6 includes: providing the at least one chip 4, wherein the chip 4 comprises a top side and a bottom side opposite to the top side, wherein the top side is provided with electrodes 41 and the bottom side is provided with a backside layer 42, bonding the backside layer 42 to the first redistribution layer 3.

As an example, the backside layer 42 may be made of metallic materials or insulating materials, and it increases the distance between the chip 4 and the first redistribution layer 3 and helps isolate the chip 4 from the antenna layers.

As an example, the backside layer 42 is connected to the first redistribution layer 3 by a bonding layer (not shown), and the method for bonding the backside layer 42 to the first redistribution layer 3 comprises adhesive film bonding, soldering or other suitable bonding method. Specifically, a die-attach film (DAF) or wafer glue may be used to coat a side of the backside layer 42 away from the electrodes 41, and the coated chip to is bonded to the first redistribution layer 3; and UV tape may be applied when applying the film to the backside layer 42. The chip should be placed with the top side (the side with the electrodes 41) facing up.

Referring to FIG. 9, step S7 includes: forming the second packaging layer 43 to encapsulate the second conductive pillar 33 and the chip 4, and thinning the second packaging layer 43 to expose the top surfaces of the second conductive pillar 33 and the electrodes 41.

As an example, the second packaging layer 43 is made of thermosetting materials, which may include one or more of polymer-based materials, resin-based materials, polyimide, and epoxy resin, and may be formed by any one of compression molding, transfer molding, liquid sealing molding, vacuum lamination, and spin coating.

As an example, the method for thinning the second packaging layer 43 may include thinning the packaging layer by a grinding process after the packaging layer is molded, or removing some of the thermosetting materials to reveal the second conductive pillar 33 during the process of molding the second packaging layer while the thermosetting materials have not yet become rigid, which not only avoid grinding processes, but make the height of the second conductive pillar more controllable.

Referring to FIG. 10, step S8 includes: forming the second redistribution layer 5 over the second packaging layer 43, wherein the second conductive pillar 33 is electrically connected to the second redistribution layer 5 and the electrodes 41 are connected to the second redistribution layer 5.

As an example, manufacturing the second redistribution layer 5 comprises: forming an initial dielectric layer over the second packaging layer 43 by chemical vapor deposition or physical vapor deposition and etching the initial dielectric layer to form a patterned dielectric layer 51 (i.e., the third dielectric layer); forming a metal layer over the third dielectric layer 51 by physical vapor deposition, chemical vapor deposition, sputtering, electroplating, chemical plating, or other suitable method, and etching the metal layer to form the metal interconnection layer 52. Materials of the dielectric layer include one or coating, or more of epoxy resin, silicone, polyimide, silicon oxide, phosphor silica glass, and fluorine containing glass, and materials of the metal interconnection layer include one or more of copper, aluminum, nickel, gold, silver, and titanium. Specifically, the above steps can be repeated as needed to form a plurality of dielectric layers 51 and a plurality of metal interconnection layers 52 that are alternately stacked together.

As an example, the electrodes 41 may be electrically connected to the second redistribution layer 5 by a bond-on-trace method; the chip 4 may have a substrate or multiple circuits in it; the type and number of chips in the packaging structure may be adjusted as needed; materials of the electrodes 41 include but are not limited to conductive materials such as copper, nickel, tin, silver, etc.

Referring to FIG. 11, step S9 includes: forming the solder bump 6 over the second redistribution layer 5, wherein the solder bump 6 is electrically connected to the second redistribution layer 5.

As an example, prior to forming the solder bump 6, a laser may be employed to open a window in the third dielectric layer 51 of the second redistribution layer 5 to partially reveal the metal interconnection layer 52, and then to form the solder bump 6 in the window, the solder bump 6 may comprise a metal pillar and a solder joint, or just a tin ball.

As an example, after forming the solder bump 6, as shown in FIG. 12, the method may further include a step of removing the support carrier 1 and the release layer 11 to obtain an intermediate structure and cutting the intermediate structure to obtain a plurality of final packaging structures.

As an example, the method for removing the release layer 11 and the support substrate 1 includes at least one of mechanical stripping, chemical etching, mechanical grinding, thermal baking, ultraviolet irradiation, laser ablation, and chemical mechanical polishing. Specifically, a suitable method is selected according to materials of the release layer 11; for example, when the release layer 11 is made of a photo-thermal conversion material, the release layer 11 may be irradiated by laser to make it less adhesive, and then the support carrier 1 and the release layer 11 are torn away from the first dielectric layer 12.

In the method for manufacturing a fan-out packaging structure, only one support carrier is used to realize integrated packaging of multiple layers of antennas and a chip, thereby improving the integration of the packaging structure, reducing the package size, and increasing packaging efficiency; in addition, the backside layer helps isolate the chip from the antenna layers, which can reduce electromagnetic interference between the chip and the antennas, and improve performance of the packaging structure.

Embodiment 2

A fan-out packaging structure is provided in this embodiment, referring to FIG. 12. The fan-out packaging structure includes a first dielectric layer 12, a first antenna layer 2, a first packaging layer 22, a first redistribution layer 3, a second packaging layer 43, a second redistribution layer 5 stacked in sequence, and also includes a first conductive pillar 21, a second conductive pillar 33, a chip 4, and a solder bump 6; wherein the first redistribution layer 3 includes a second antenna layer 32 and a second dielectric layer 31 encapsulating the second antenna layer 32; the first conductive pillar 21 is located within the first packaging layer 22, with both ends of the first conductive pillar 21 electrically connected to the first antenna layer 2 and the second antenna layer 32, respectively; the second conductive pillar 33 is located within the second packaging layer 43, with both ends of the second conductive pillar 33 electrically connected to the second antenna layer 32 and the second redistribution layer 5; the chip 4 is located in the second packaging layer 43, and includes a top side and a bottom side that are opposite to each other, the top side is provided with electrodes 41, the bottom side is provided with a backside layer 42; the electrodes 41 are electrically connected to the second redistribution layer 5; the backside layer 42 is bonded to the first redistribution layer 3; the solder bump 6 is located on a side of the second redistribution layer 5 away from the second packaging layer 43 and is electrically connected to the second redistribution layer 5.

As an example, the first antenna layer 2 and the second antenna layer 32 each comprise at least one antenna structure.

As an example, the first redistribution layer 3 may also comprise additional antenna layers, and adjacent antenna layers may be isolated from each other by at least one of a plastic seal layer, and a polymer layer.

As an example, the second redistribution layer 3 comprises at least one patterned dielectric layer 51 and at least one patterned metal interconnection layer 52 alternately stacked in a vertical direction (the direction perpendicular to the support carrier).

As an example, materials of the first packaging layer 22 and the second packaging layer 43 comprise at least one of polymer-based materials, resin-based materials, polyimide, and epoxy resin.

As an example, the backside layer 42 may be a metal layer or an insulating layer.

As an example, the backside layer 42 further comprises a bonding layer (not shown) between the backside layer 42 and the first redistribution layer 5, and the bonding layer may be an adhesive-film layer, or a solder layer.

As an example, the packaging structure sends and receives 5G millimeter waves.

The fan-out packaging structure integrates multiple antenna layers and chips, which has a smaller package size and higher antenna efficiency, and the backside layer in the packaging structure helps isolate the antennas from the chip, thereby reducing electromagnetic interference between the antennas and the chip.

In summary, in the fan-out packaging structure and the method for manufacturing the same, only one support carrier is used to realize integrated packaging of multiple layers of antennas and a chip, thereby improving the integration of the packaging structure, reducing the package size, and increasing packaging efficiency; in addition, the backside layer helps isolate the chip from the antenna layers, thereby improving performance of the packaging structure. Therefore, the present disclosure effectively overcomes various shortcomings of the prior art and has a high industrial value.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A method for manufacturing a fan-out packaging structure, comprising:

forming a release layer over a support carrier, and forming a first dielectric layer over the release layer;

forming a first antenna layer over the first dielectric layer, and forming a first conductive pillar over the first antenna layer, wherein the first conductive pillar is electrically connected to the first antenna layer;

forming a first packaging layer over the first dielectric layer to encapsulate the first antenna layer and the first conductive pillar, followed by thinning the first packaging layer to expose a top surface of the first conductive pillar;

forming a first redistribution layer over the first packaging layer, wherein the first redistribution layer comprises a second antenna layer and a second dielectric layer, wherein the second dielectric layer encapsulates the second antenna layer, and wherein the second antenna layer is electrically connected to the first conductive pillar;

forming a second conductive pillar over the first redistribution layer, wherein the second conductive pillar is electrically connected to the second antenna layer;

providing at least one chip, wherein the chip comprises a top side and a bottom side opposite to the top side, wherein the top side is provided with electrodes and the bottom side is provided with a backside layer, wherein the backside layer is bonded to the first redistribution layer;

forming a second packaging layer to encapsulate the second conductive pillar and the chip, followed by thinning the second packaging layer to expose top surfaces of the second conductive pillar and the electrodes of the chip;

forming a second redistribution layer over the second packaging layer, wherein the second conductive pillar is electrically connected to the second redistribution layer, and wherein the electrodes of the chip are connected to the second redistribution layer; and forming a solder bump over the second redistribution layer, wherein the solder bump is electrically connected to the second redistribution layer.

2. The method for manufacturing the fan-out packaging structure according to claim 1, wherein the support carrier comprises at least one of a glass carrier, a metal carrier, a semiconductor carrier, a polymer carrier, and a ceramic carrier.

3. The method for manufacturing the fan-out packaging structure according to claim 1, wherein the release layer is made of at least one of a tape and polymer, and is molded by UV curing or thermal curing.

4. The method for manufacturing the fan-out packaging structure according to claim 1, wherein the backside layer is made of one or more of metallic materials and insulating materials.

5. The method for manufacturing the fan-out packaging structure according to claim 1, wherein the backside layer is bonded to the first redistribution layer by an adhesive film or soldering.

6. The method for manufacturing the fan-out packaging structure according to claim 1, wherein after forming the solder bump, the method further comprises: removing the support carrier and the release layer to obtain an intermediate packaging structure, and cutting the intermediate packaging structure to obtain a plurality of final packaging structures.

* * * * *